(12) United States Patent
Maekawa et al.

(10) Patent No.: US 6,228,693 B1
(45) Date of Patent: *May 8, 2001

(54) SELECTED SITE, METAL-INDUCED, CONTINUOUS CRYSTALLIZATION METHOD

(75) Inventors: Masashi Maekawa; Yukihiko Nakata, both of Vancouver, WA (US)

(73) Assignees: Sharp Laboratories of America, Inc., Camas, WA (US); Sharp Kabushiki Kaisha, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,831

(22) Filed: Jun. 5, 1998

(51) Int. Cl.[7] .................................................. H01L 21/324
(52) U.S. Cl. ............................ 438/166; 438/486; 438/487
(58) Field of Search ..................................... 438/155, 163, 438/142, 149, 162, 166, 308, 486, 487, FOR 155

(56) References Cited

U.S. PATENT DOCUMENTS

| | | | |
|---|---|---|---|
| 5,147,826 | 9/1992 | Liu et al. ............................. | 437/233 |
| 5,275,851 | 1/1994 | Fonash et al. ....................... | 427/578 |
| 5,488,000 | * 1/1996 | Zhang et al. ......................... | 438/162 |
| 5,501,989 | * 3/1996 | Takayama et al. ................... | 438/162 |
| 5,639,698 | * 6/1997 | Yamazaki et al. ................... | 438/166 |
| 5,643,826 | * 7/1997 | Ohtani et al. ........................ | 438/162 |
| 5,773,329 | * 6/1998 | Kuo ..................................... | 438/162 |
| 5,804,473 | * 9/1998 | Takizawa ............................. | 438/162 |
| 5,818,076 | 10/1998 | Zhang et al. ......................... | 257/255 |
| 5,821,138 | 10/1998 | Yamazaki et al. ................... | 438/166 |
| 5,824,574 | 10/1998 | Yamazaki et al. ................... | 438/150 |

OTHER PUBLICATIONS

"Low Temperature Poly–Si Thin–Film Transistor Fabrication By Metal–Induced Lateral Crystallization", Lee et al, IEEE Electron Device Letters vol. 17, No. 4, Apr. 1996.*
"Silicide Formation and Silicide–Mediated Crystallization of Nickel–Implanted Amorphous Silicon Thin Films" By Hayzelden. Amrican Institute of Physics J.Appl Phys 73(12), Jun. 15, 1993.*
Pd Induced Lateral Crystallization of Amorphous Si Thin Films By Lee et al Appl. Phys. Lett. 66(13) Mar. 1995.*
"Al Induced Crystallization of Ov–Si", By Radnoczi et al J. Appl. Phys. 69(9), May 1, 1991.*

* cited by examiner

*Primary Examiner*—Savitri Mulpuri
(74) *Attorney, Agent, or Firm*—David C. Ripma; Matthew D. Rabdau; Scott C. Krieger

(57) ABSTRACT

A method has been provided to form a sheet of large grain crystallized silicon, in an early stage of transistor production, before the areas of the source and drain are defined. The method takes advantage of high annealing temperatures and transition metals to speed the lateral growth of silicide. By using higher temperatures, the number of amorphous enclaves is minimized and the transition metal nucleation site can be made small. A small transition metal nucleation site, in turn, can be more easily located near the center of a transistor, or where it is convenient. After annealing, the areas close to the silicide nucleation site are transformed into polycrystalline with a high electron mobility, desirable for the formation of source/drain and channel regions. Silicide products, away from the transistor active areas, are etched away when the area of the source and drain are defined. A product by process using the method of the above-described invention is also provided.

21 Claims, 8 Drawing Sheets

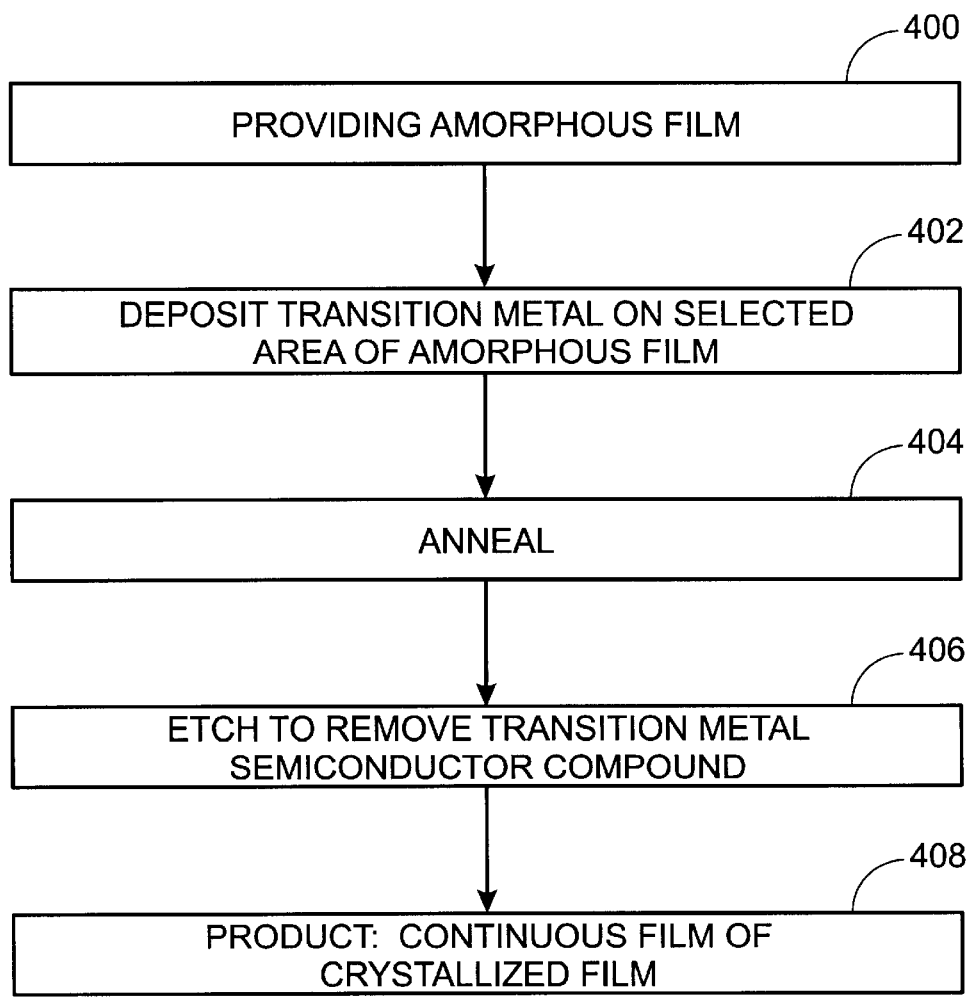

SELECTED SITE, METAL-INDUCED, CONTINUOUS CRYSTALLIZATION METHOD

BACKGROUND AND SUMMARY OF THE INVENTION

This invention relates generally to thin-film transistor (TFT) processes and fabrication, and more particularly, to a TFT polycrystalline film, and method of forming large grain sheets of polycrystalline silicon using transition metals semiconductor compounds, such as nickel silicide, to induce the crystallizing of an amorphous film through lateral growth from selective locations on a silicon wafer.

The demand for smaller electronic consumer products with higher resolution displays, spurs continued research and development in the area of liquid crystal displays (LCDs). The size of LCDs can be decreased by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/Vs$. Carrier mobility is improved by using crystallized silicon. Single crystal silicon transistors, which are usually used in TFT driver circuits, have electron mobilities on the order of 500 to 700 $cm^2/Vs$. Polycrystalline silicon transistor performance is between the two extremes, having mobilities on the order of 10 to 400 $cm^2/Vs$. Thin-film transistors having mobilities greater than 100 $cm^2/Vs$ would probably be useful in replacing LCD periphery mounted driver circuitry. However, it has been difficult to produce polycrystalline TFTs with electron mobilities of even 40 to 50 $cm^2/Vs$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600 °C. for substantial lengths of time. Even the fabrication of polycrystalline silicon transistors has been very difficult due to the necessity of using low temperature crystalline processes when glass is involved. Current polycrystalization processes typically require annealing times of approximately 24 hours, at 600° C., to produce TFTs having a mobility of approximately 30–50 $cm^2/Vs$. These processes are not especially cost effective due to the long process times, and the TFTs produced are not suitable for LCD driver circuits.

The process of heating amorphous silicon to form crystallized silicon is not entirely understood, and research on the subject continues. Variations in temperature, film thickness, the degree to which the amorphous matter melts, impurities in the film, and a range of other factors influence the annealing of amorphous silicon. Generally, large grains of crystallization, or crystallization able to support high carrier mobilities, occur in a polycrystalline film at a specific temperature near the melting point. Temperatures below this preferred temperature do not melt the amorphous silicon enough to form large grain areas, or to form uniformly crystallized film. Temperatures above the preferred temperature rapidly lead to bulk nucleation. The bulk nucleation of amorphous matter results in the spontaneous crystallization of an amorphous film into relatively small grain sizes so that the electron mobility is relatively poor.

Various annealing methods exist for turning amorphous silicon into polycrystalline silicon. The direct deposition of amorphous silicon film is probably the cheapest method of fabricating TFTs. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultrahigh vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources, are used. In a hot wire CVD system the production of activated hydrogen atoms leads to the decomposition of the source gases. However, TFTs made from direct deposition have poor performance characteristics, with mobilities on the order of 1 to 10$cm^2/Vs$.

Solid phase crystallization (SPC) is a popular method of crystallizing silicon. In this process, amorphous silicon is exposed to heat approaching 600° C. for a period of at least several hours. Typically, large batches of LCD substrates are processed in a furnace having a resistive heater source. TFTs made from this crystallization process are more expensive than those made from direct deposition, but have mobilities on the order of 50 $cm^2/Vs$. A rapid thermal anneal (RTA) uses a higher temperature, but for very short durations of time. Typically, the substrate is subjected to temperatures approaching 700 or 800° C. during the RTA, however, the annealing process occurs relatively quickly, in minutes or seconds. Glass substrates remain unharmed due to the short exposure time. Because the process is so rapid, it is economical to process the substrates serially. Single substrates can also be brought up to annealing temperatures faster than large batches of substrates. A tungsten-halogen, or Xe Arc, heat lamp is often used as the RTA heat source.

An excimer laser crystallization (ELC) process has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformities into the annealing process. Further, the wafers must be annealed serially, instead of in a furnace in batches. Although mobilities of over 100 $cm^2$/Vs are obtainable, TFTs made by this method are significantly more expensive than those made by direct deposition or SPC.

Also under investigation is the use of metal, such as aluminum, indium tin oxide, and transition metals such as nickel, cobalt, and palladium to encourage the crystallization of silicon. Nickel seems especially promising, as the lattice mismatch between nickel di-silicide and silicon is small, less than 1%. In general, nickel has been used to reduce the annealing temperature typically required in a conventional solid phase crystallization (SPC) from approximately 600° C. to a temperature in the range between approximately 500 to 550° C., so that the LCD substrates are less susceptible to shrinkage. The use of nickel also significantly shortens the annealing process times. TFTs made through this process are comparable in cost with those made by the SPC method, and the mobilities of metal-induced TFTs can approach 100$cm^2$/Vs.

However, metal-induced crystallization requires the deposition of a transition metal on an amorphous silicon film, and annealment of the transition metal with the amorphous silicon. The result of annealing is dependent on how far the transition metal compounds have spread into the amorphous film. The possible results of annealment are unreacted amorphous silicon (or bulk nucleated silicon), unreacted transition metal, mono-silicide, and di-silicide. All of these compounds can induce high leakage currents in a transistor.

Liu et al., U.S. Pat. No. 5,147,826, disclose the deposition of a non-continuous metal film on amorphous silicon so that the annealing temperature can be reduced to approximately 550 to 650° C. Fornash et al., U.S. Pat. No. 5,275,851 disclose a method of depositing extensive areas of metal film to silicon, and low annealing temperatures to crystallize silicon. However, neither method fosters the silicide-enhanced lateral crystal growth needed to fabricate polycrystalline silicon TFTs with very high electron mobility. Neither method discloses a method of controlling the lateral growth of silicide to eliminate unreacted metal and silicides in key areas of the transistor.

A method of rapid thermal annealing nickel silicide with amorphous silicon is presented in co-pending U.S. Pat. Ser. No. 08/879,386, filed Jun. 20, 1997, entitled "Thin-Film Transistor Polycrystalline Film Through Nickel Induced, Rapid Thermal Annealing and Method for Same", invented by Masashi Maekawa, Attorney Docket No. SMT 258, which is assigned to the same assignees as the instant application. This patent application discloses the use of an RTA process to increase the quality of the polycrystalline, and to reduce annealing times. However, the invention does not disclose a method of preventing the incursion of nickel into sensitive areas of a transistor.

A method of selectively depositing nickel silicide to crystallize transistor source/drain regions in a two-step annealing process is presented in co-pending U.S. Pat. Ser. No. 08/893,285, filed Jul. 15, 1997, entitled "Selective Silicide Thin-Film Transistor and Method for Same", invented by Masashi Maekawa, Attorney Docket No. SMT 239, which is assigned to the same assignees as the instant application. However, metal-induced annealment processes, in the later stages of transistor fabrication, can be cumbersome in some applications.

It would be advantageous if metal-induced annealment processes could be used to fabricate broad areas of high quality polycrystalline films in critical areas of the transistor.

It would be advantageous if transistor active areas could be formed with a transition metal at an early stage of transistor fabrication.

It would be advantageous if the unreacted transition metals and silicide products could be easily removed after annealment.

It would be advantageous if silicide metal could be placed in convenient, non-critical areas of the transistor to initiate silicon crystallization, without impacting the design layout or component placements.

Accordingly, a method for crystallizing a thin amorphous film is provided comprising the steps of:

depositing a transition metal on small selected areas of a first film layer top surface, forming a very small transition metal nucleus to act as a source for lateral growth of the transition metal in the subsequent annealing step. The nucleus is less than one-tenth the size of the crystallized area, and is typically over 100 times smaller;

annealing the amorphous first film with the transition metal, laterally growing the transition metal compounds to migrate out in a front from the selected areas, temporarily forming transition metal semiconductor compounds in an expanding front through the amorphous first film, upon cooling, the transition metal semiconductor compounds transform into polycrystalline; and selectively etching the annealed first film to remove any remaining transition metal semiconductor compounds. In this manner, a relatively large sheet of polycrystalline material of large grain size is formed for improved electron mobility between regions.

The transition metals are selected from Al, which tends to act as transition metals, and from Ni, Ti, Co, and Pd. The first film material is either silicon, germanium, silicon carbide, or a silicon-germanium compound.

A second film layer overlies the first film, and is selectively etched so that openings are formed through the second film to access and define the first film selected areas. Then, transition metal is deposited through the openings to form transition metal nucleuses in the first film selected areas.

When high annealing temperatures are used, above 600degrees C., such as in an RTA annealing process, the lateral growth front moves faster. As a result, a smaller transition metal nucleus is required when higher annealing temperatures are used. When the annealing temperature exceeds 600 degrees C., the transition metal nucleus selected areas have a size in the range between 5 and 50 square microns ($\mu^2$). The transition metal is a thin, discontinuous film inside the selected areas. Smaller transition metal nucleuses permit the transistor designer more flexibility of placement. That is, the transition metal nucleus is small enough to deposited between device patterns on the IC.

The rate of lateral growth of the transition metal is known to be dependent the annealing temperature. Therefore, the location of silicide products on the growth expansion front are known. By etching away all products at a distance approximately 30$\mu$ from the edges of the silicide nucleus selected areas, only the crystallized first film remains.

A thin-film transistor (TFT) product formed through the above-described process, having low leakage current and high electron mobility, is also provided. The TFT comprises source/drain and channel regions of crystallized first film material formed through depositing transition metal on selected areas of a first film and annealing the first film. The lateral growth along an expanding front forms transition metal semiconductor compounds behind an expansion front adjoining the amorphous first film, leaving crystallized first film material behind the front, after the film is cooled. After annealment, a pattern is etched in the annealed first film to remove the transition metal semiconductor compounds on the lateral growth front. The pattern of crystallized film is at least ten times larger than the transition metal nucleus, and is typically over 100 times larger. Subsequently, the source and drain areas can be defined in the crystallized film, and the areas surrounding the source/drain can be etched and oxidized to insulate the active areas of the transistor.

The TFT also includes a gate oxide layer overlying the channel region, and a gate electrode overlying the gate oxide layer. Alternately, a bottom gate TFT can be fabricated using the abovedescribed procedure. The transition metal semiconductor compounds have been removed to improve leakage current. The large grain crystalline active areas of the transistor have high electron mobility.

Typically, the TFT further comprising a glass substrate, and a barrier layer overlying said glass substrate. The etched polycrystalline area is formed overlying said barrier level. Such a transistor device is useful in fabricating a liquid crystal display (LCD).

BRIEF DESCRIPTION OF THE DRAWINGS

FIG. 14 is a flow chart illustrating another aspect of the method for crystallizing an amorphous film.

DETAILED DESCRIPTION OF THE PREFERRED EMBODIMENT

Figure 1:
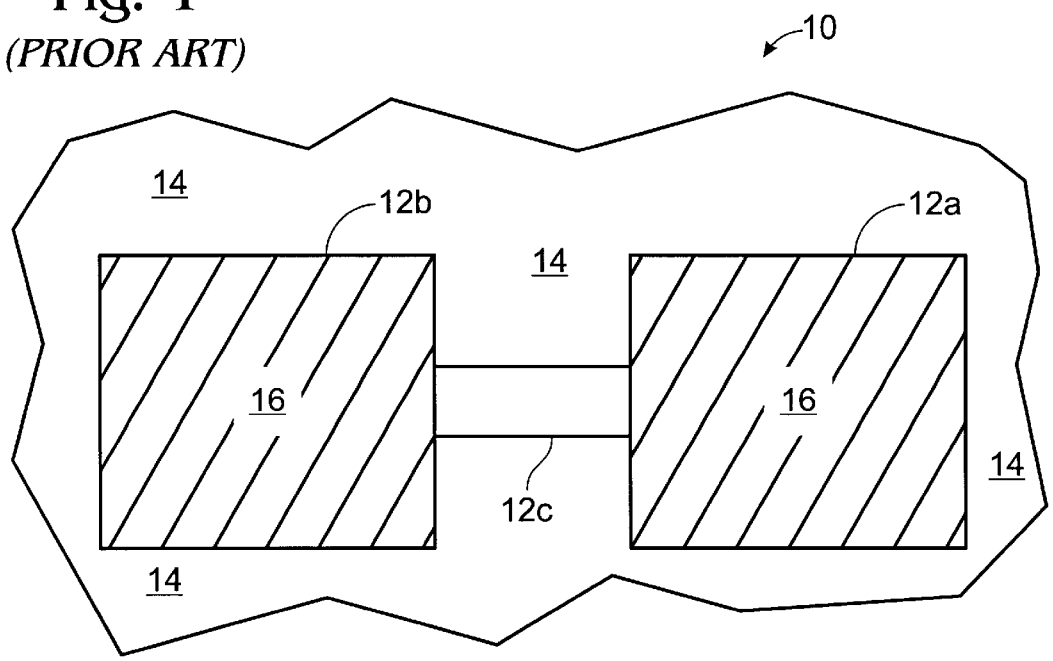
FIGS. 1–2 illustrate a conventional salicide process to crystallize source/drain regions of a transistor (prior art).
Figure 2:
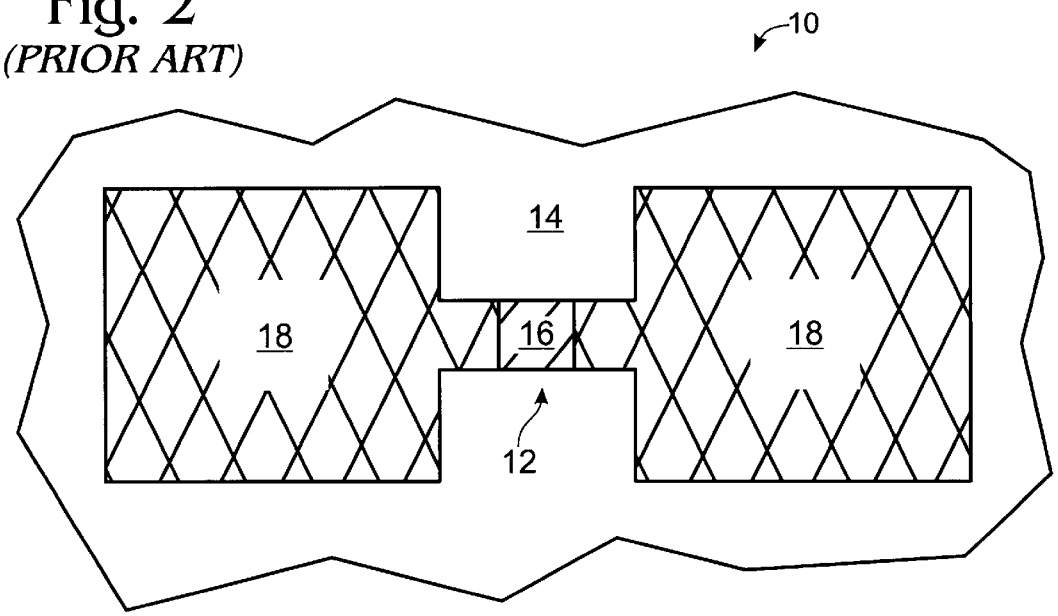

FIGS. 1–2 illustrate a conventional salicide process to crystallize source/drain regions of a transistor (prior art). FIG. 1 is a plan view of a transistor 10 in fabrication having silicon source 12a, silicon drain 12b, and silicon channel region 12c. Silicon regions 12a, 12b, and 12c are surrounded by oxidized silicon 14, or a similar insulating material. The source and drain regions 12a and 12b are covered with a layer of transition metal 16. It is typical in the deposition of transition metal layer 16 to cover surrounding areas 14, however, in the self–aligning silicide (salicide) process transition metal 16 only reacts with silicon. Therefore, metal 16 is not shown overlying areas 14. Transition metal 16 is also not shown overlying channel region 12c, since channel region 12c is usually covered by a gate oxide layer, and even a gate electrode at this stage of the process. Neither the gate oxide layer, nor gate electrode is shown for the sake of clarity.

FIG. 2 illustrates transistor 10 of FIG. 1 following an annealing process. Transition metal 16 has moved along a lateral growth front out from silicon areas 12a and 12b. At the finish of the annealing process the two growth fronts intersect in the center of the channel region, labeled 12d. The silicon regions behind the growth front of transition metal 16 have been transformed with transition metal 16 into crystallized silicon 18. That is, silicon areas 12a, 12b, and parts of 12c have been crystallized. Although the bulk of silicon areas 12a and 12b may be crystallized silicon, devoid of transition metal semiconductor compounds, such as silicide, the limited source of amorphous silicon in area 12c and the intersecting fronts may result in an area of silicide in channel region 12d.

Typically, source drain areas 12a and 12b are amorphized in response to large doping implants in the formation of active source/drain regions. When source/drain regions 12a and 12b are annealed again for implant activation, a danger exists that transition metal grains 16 in channel region 12d could migrate back into the amorphous source/drain regions 12a and 12b. The presence of transition metal grains in source/drain regions 12a and 12b increases leakage current as transition metal 16 tends to act as a short across the reverse bias junction.

Figure 3:
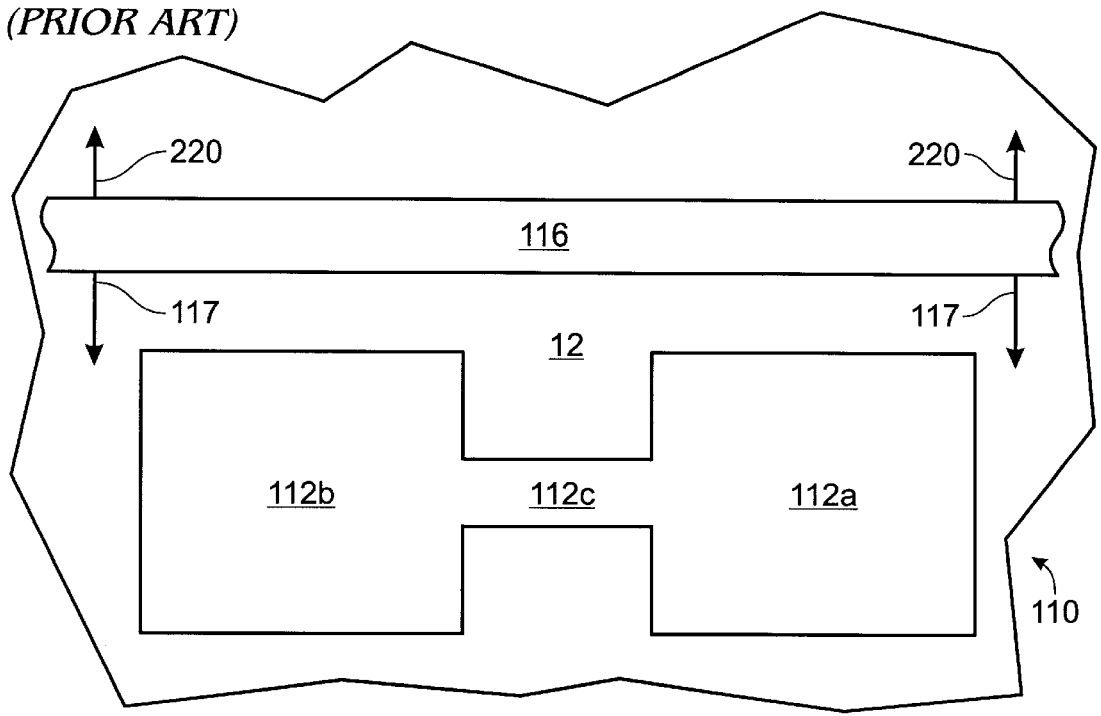
FIGS. 3–4 illustrates a transistor being formed on a layer of amorphous silicon, where a silicidation metal is introduced outside transistor active regions (prior art).
Figure 4:
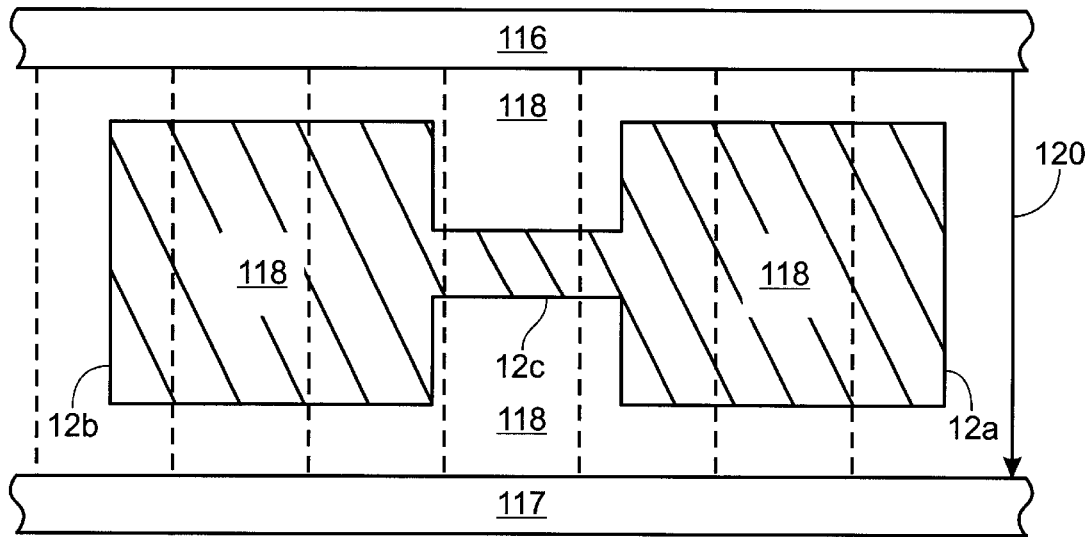

FIGS. 3–4 illustrates a transistor 110 being formed on a layer of amorphous silicon 112, where silicidation metal 116 is introduced outside transistor active regions (prior art). FIG. 3 depicts source 112a, drain 112b, and channel 112c to be formed from amorphous silicon layer 112 after crystallization. During annealment, a front of transition metal 16, represented by arrows 117, grows across silicon layer 12.

FIG. 4 illustrates transistor 110 after annealment. The lateral growth has continued through active areas 112a, 112b, and 112c. That is, the front of unreacted transition metal 116, in the form of a transition metal semiconductor compound 117 has moved through silicon film 112. Behind the lateral growth front of transition metal 116 front, is a polycrystalline silicon 118. Actually, the entire sheet of silicon 112 of FIG. 3 behind the growth front has been converted into polycrystalline silicon 118, including active areas 112a, 112b, and 112c. The dotted lines running across polycrystalline film 118 represent borders between areas of identical lattice alignment. After annealment, transition metal compounds in areas 116 and 117 are etched away. Transistor active areas 112a, 112b, and 112c are free of silicide 117. However, a long annealing time was required because of the long lateral crystallization length or growth front, represented by arrow 120. Further, suicide regions 116 and 117 cannot be used in device fabrication, imposing restrictions upon device layout.

Figure 5:
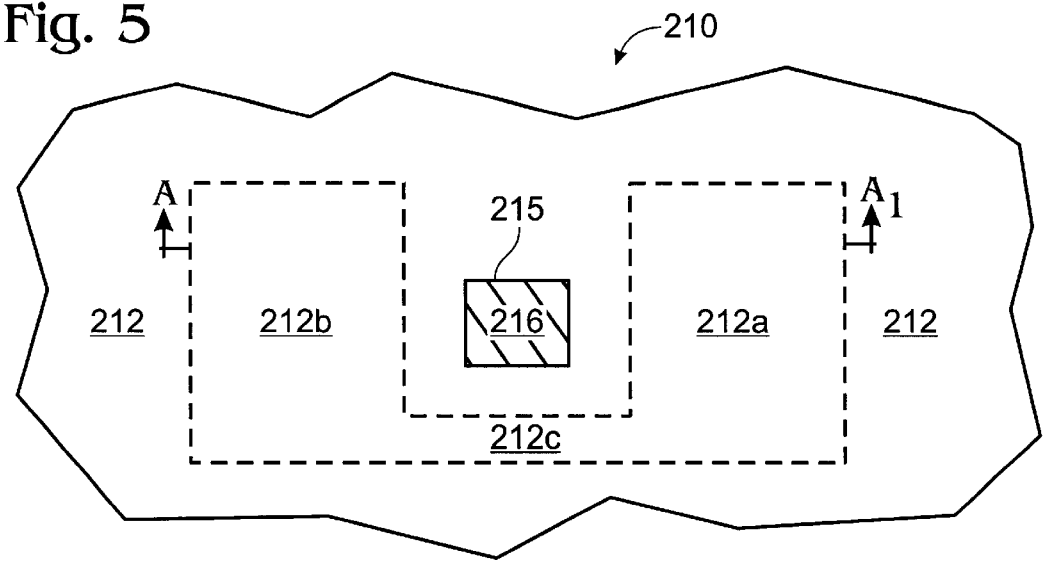
FIGS. 5–9, and 12 illustrate steps in the formation of a completed thin-film transistor (TFT) having low leakage current and high electron mobility in accordance with the present invention.

FIGS. 5–9, and 12 illustrate steps in the formation of a completed thin-film transistor (TFT) having low leakage current and high electron mobility in accordance with the present invention. FIG. 5 is a plan view of transistor 210 being formed from an amorphous first film 212. Areas 212a, 212b, and 212c marked with dotted lines represent the locations, respectively of the source, drain, and channel, which are formed later in the fabrication process. A selected area 215 of amorphous first film 212 forms a transition metal nucleus with the deposition of a transition metal 216. Transition metal 216 is deposited by any means known in the art, including ion implantation.

Figure 6:
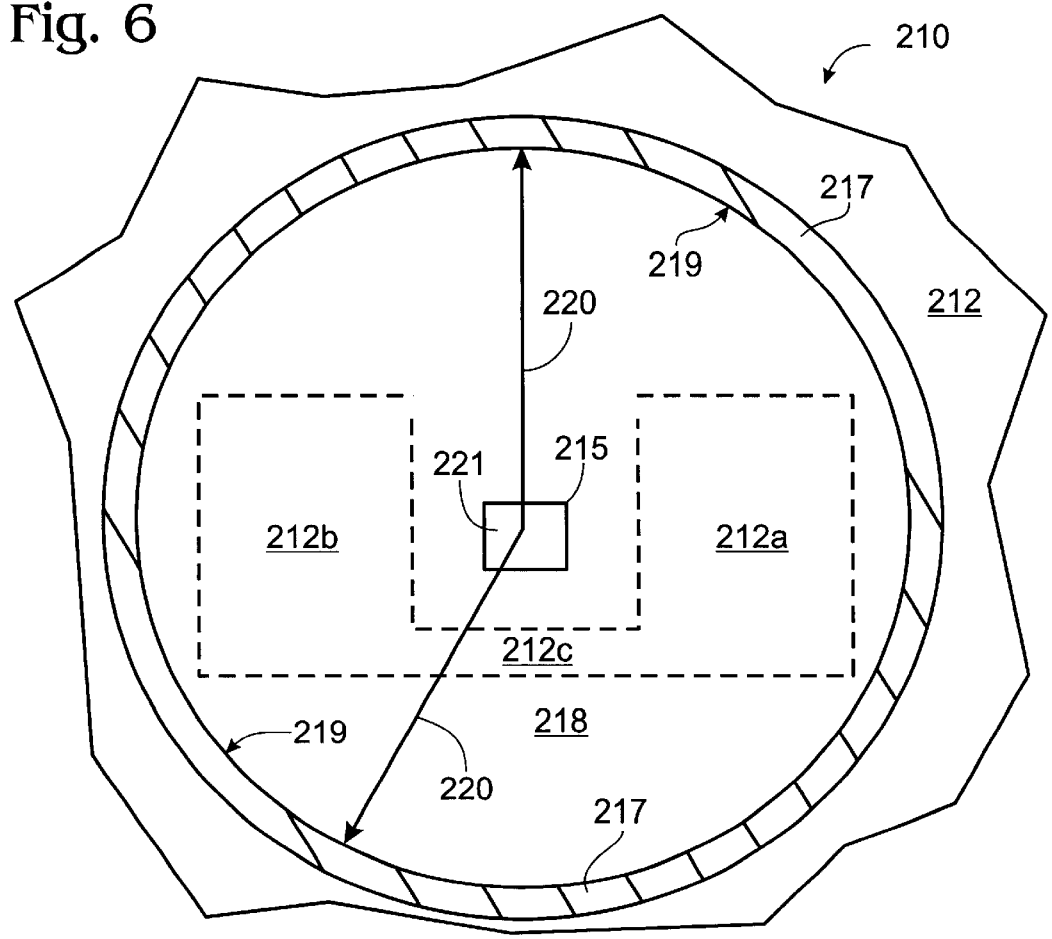

FIG. 6 depicts transistor 210 of FIG. 5 after annealing of first film 212. During annealing, transition metal semiconductor compounds 217 grow laterally along an expansion front which is centered on selected area 215. Crystallized first film material 218 is formed in a growth area, which is at least ten times larger than transition metal nucleus selected area 215, between transition metal nucleus 215 and expansion front 219. In some aspects of the invention, growth area 218 is at least 100 times larger than selected area 215. The lateral growth expanding front and the direction of growth are represented by arrows 220. Lateral growth front 219 extends a distance of approximately 30 μm from any edge, such as edge 221, of selected area 215. An area with a diameter of 60μ is a practical size in which to form a typical transistor. Transition metal semiconductor compounds 217 are formed on the front, surrounded by an outer area of amorphous first film 212. Amorphous first film 212 outside front 219 sometimes undergoes bulk nucleation in response to the annealing temperatures. Alternately, selected area 215 is a narrow strip as shown in FIG. 3. Then, the lateral growth front is one dimensional as shown by reference designator 117. Alternately, the lateral growth is two dimensional as shown by reference designators 117 and 220. Regardless of whether the growth is one or two dimensional, the crystallized area is at least ten times the transitional metal selected area.

Figure 7:
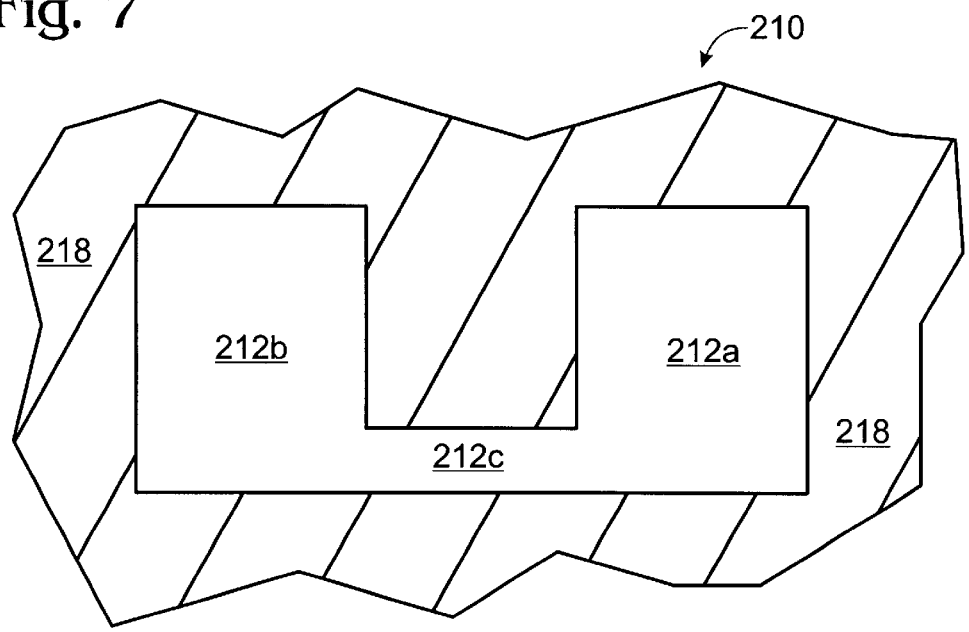

FIG. 7 depicts transistor 210 of FIG. 6 after etching. A pattern is etched in annealed first film, or crystallized film 218 to remove transition metal semiconductor compounds 217 on lateral growth front 219. Transistor 210 is further etched to form source/drain 212a/212b and channel regions 212c of large grain crystallized first film material 218. Alternately, the etching is performed so that source/drain 212a/212b and channel 212c have the same shape and pattern as source/drain 12a/12b of FIG. 1, with selected area 215 slightly offset from channel region 12c. With the shape of FIG. 1, the annealing process is conducted for either a slightly longer time duration, or at a higher temperature to accommodate a larger lateral growth of transition metal semiconductor compounds 217.

Figure 8:
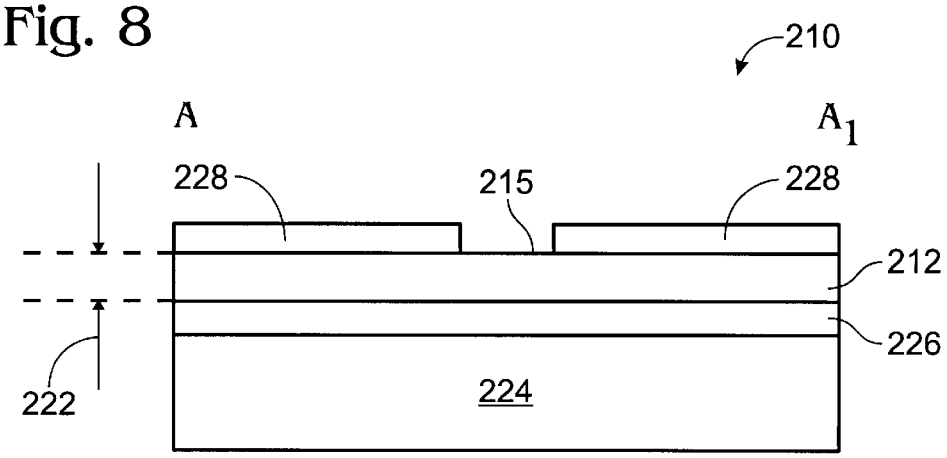

FIG. 8 is a partial cross-sectional view of transistor 210 of FIG. 5. First film 212 has a thickness 222 in the range between 200 and 10,000 Å. Typically, first film 212 is a material selected from the group consisting of silicon, germanium, silicon carbide, and silicon-germanium compounds. First film 212 is selected from the group of amorphous material and amorphous material embedded with microcrystallites. Typically, the microcrystallites are the same material as the surrounding amorphous matter. Currently, TFT transistors are often made with a first film thickness of approximately 500 Å. A glass substrate 224 and a barrier layer 226 overlie glass substrate 224, and are typically used in the fabrication of TFT 210 for an LCD. Amorphous first film 212 overlies barrier 226. A second film layer 228 overlies first film 212. Second film 228 is selectively etched, so that an opening is formed through second film 228 to access and define first film selected area 215.

Figure 9:
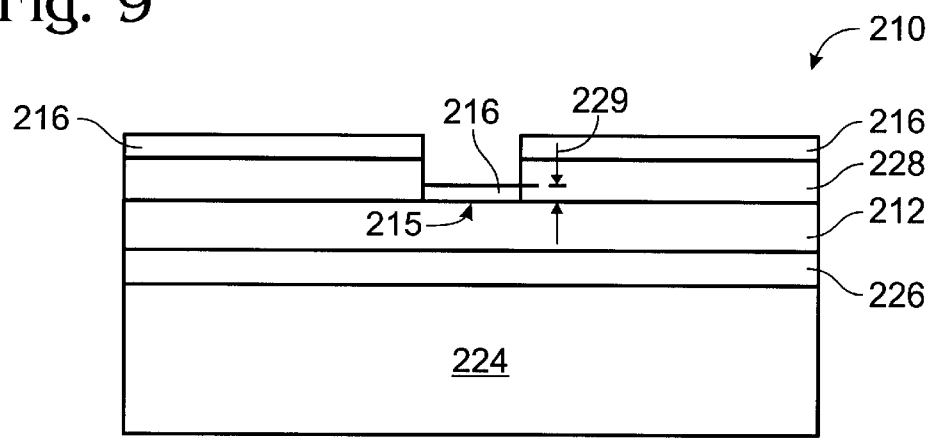

In FIG. 9, transition metal 216 is deposited through the openings etched in second film 228 to form a transition metal nucleus on first film selected area 215. Transition metal 216 is deposited, or ion implanted through the opening. The concentration of transition metal is greater than $1 \times 10^{18}$ atoms per cubic centimeter in first film 212. Thin thicknesses 229 of transition metal 216 typically is made up of discontinuous "islands" of transition metal which form many separate nucleuses for the lateral growth of a crystal grain. Transition metal 216 is selected from the group consisting of Al, which has properties similar to transition metals, and transition metals such as Ni, Ti, Co, and palladium.

After annealment, second film 228, and transition metal 216 overlying second film 226 are removed. In some aspects of the invention, second film 228 is temporary, and is removed after metal 216 is deposited. Alternately, second film 228 is a gate oxide layer, and is not removed.

In some aspects of the invention, first film 212 is preheated to a temperature below approximately 600 degrees C. to insure that substantially no crystallization occurs before the intended annealing temperature is reached. That is, the mono-transitional metal semiconductor compounds formed during some preheating steps are irrelevant to the crystallization process. Di-transitional metal semiconductor compounds 217 are not formed until the temperature exceeds approximately 550 degrees C. It is di-transitional metal semiconductor compounds 217 that cause first film 212 to begin crystallization.

The temperature is ramped-up from the preheating temperature to the annealing temperature at a rate greater than 5 degrees C. per second, whereby first film 212 is annealed at the intended temperature for larger crystal grains. Typically, the preheating temperature is a temperature less than 600 degrees C. In one aspect of the invention, the annealing is performed with an RTA process at a temperature in the range between 600 and 800 degrees C., for a time duration in the range between 1 second and 15 minutes. A higher annealing temperature corresponds to a shorter annealing time, while a lower annealing temperature corresponds to a longer annealing time.

Figure 10:
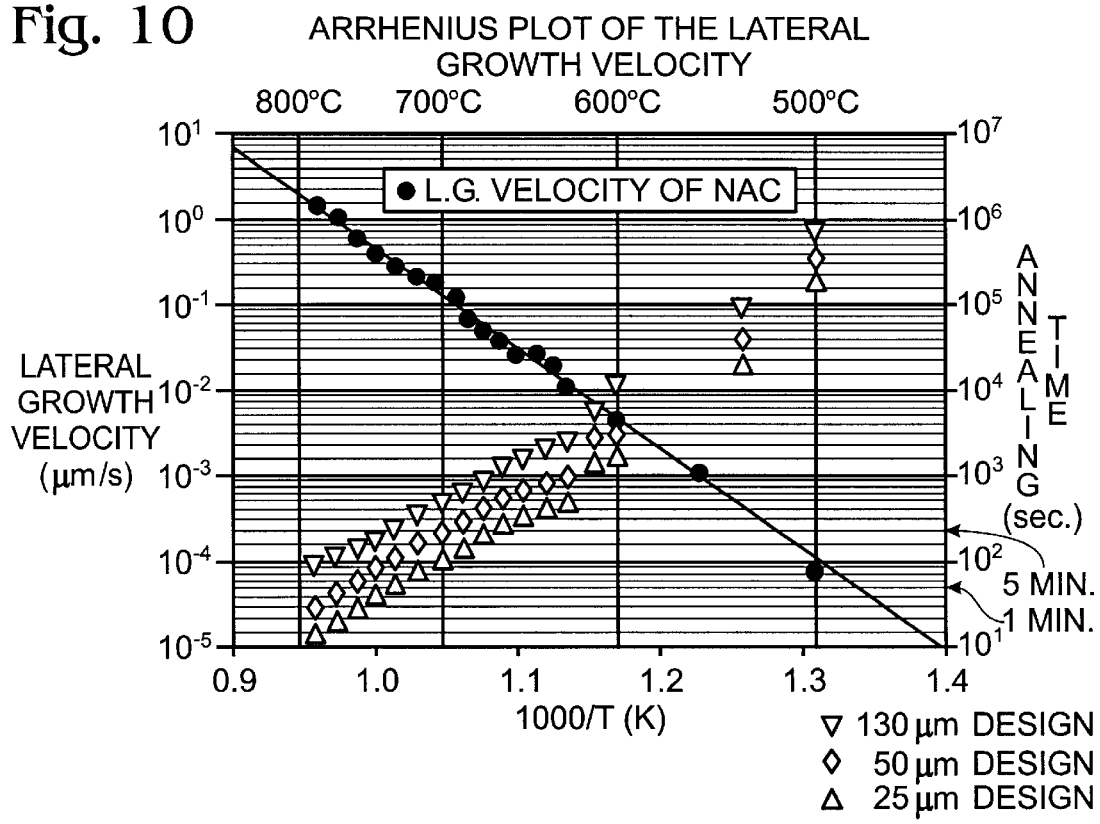
FIG. 10 is a graph depicting the relationship between annealing temperature and lateral growth velocity.

FIG. 10 is a graph depicting the relationship between annealing temperature and lateral growth velocity. The black circles represent Nickel-Aided Crystallization (NAC) of amorphous silicon per the present invention. The other shapes represent conventional SPC processes with a variety of transition metal deposition areas. With the present invention, a higher annealing temperature yields a higher growth velocity, and therefore, faster annealing time. In some aspects of the invention, an RTA process, using a sufficient temperature, induces lateral growth at a velocity in the range between 0.01 and 10 μm per second. The graph of FIG. 10 shows that an RTA process at a temperature between 650 and 750 degrees produces lateral growth velocity between 0.1 and 1 μm per second. Upper temperatures are limited by concern to the glass substrate and spontaneous nucleation of the amorphous first film.

Figure 11:
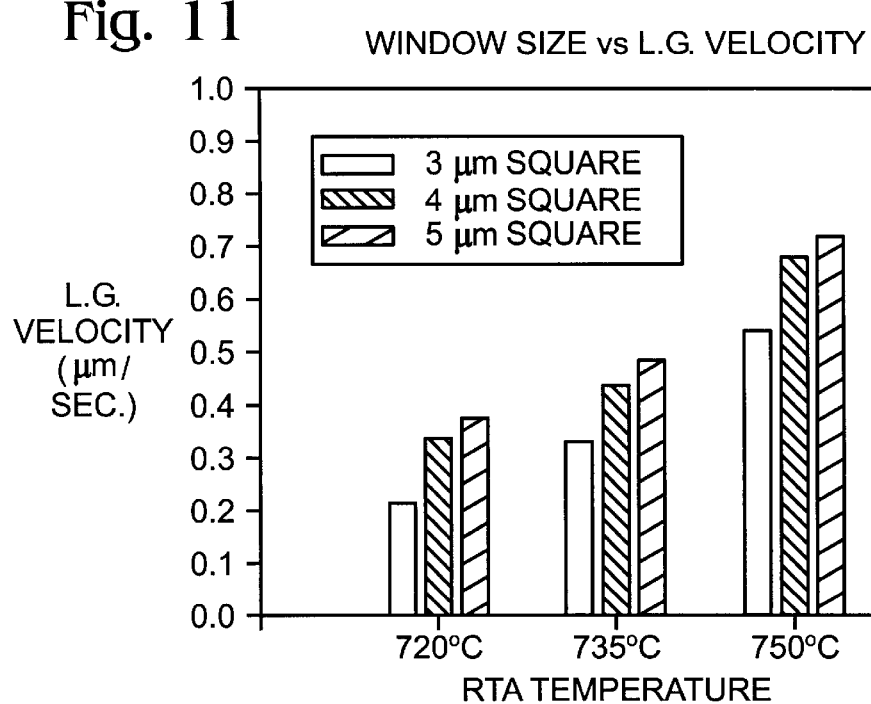
FIG. 11 is a graph depicting the relationship between window size and lateral growth velocity.

Returning briefly to FIGS. 9 and 5, there is also a relationship between selected area 215, or the window size in which transition metal 216 is deposited, and the lateral growth velocity. FIG. 11 is a graph depicting the relationship between window size and lateral growth velocity. Larger windows and higher temperatures yield the fastest velocities. However, it is more convenient to layout and place small windows. In general, the windows or transition metal nucleus selected areas have a practical area in the range between 1 and 1000 square microns ($\mu^2$). From the study of FIGS. 10 and 11, it can be seen that when transition metal nucleus is a thin discontinuous film deposited on selected areas having a range between 5 and $50\mu^2$, then the lateral growth velocity is in the range between 0.1 an 1 μm per second. Specifically, when transition metal nucleus is a thin discontinuous film deposited on selected area 215 of approximately $16\mu^2$, and when annealing is performed with an RTA process in the range between 700 and 730 degrees C. for a time duration of approximately 1 minute, then a lateral growth velocity between 0.1 and 1μ per second is obtained.

Figure 12:
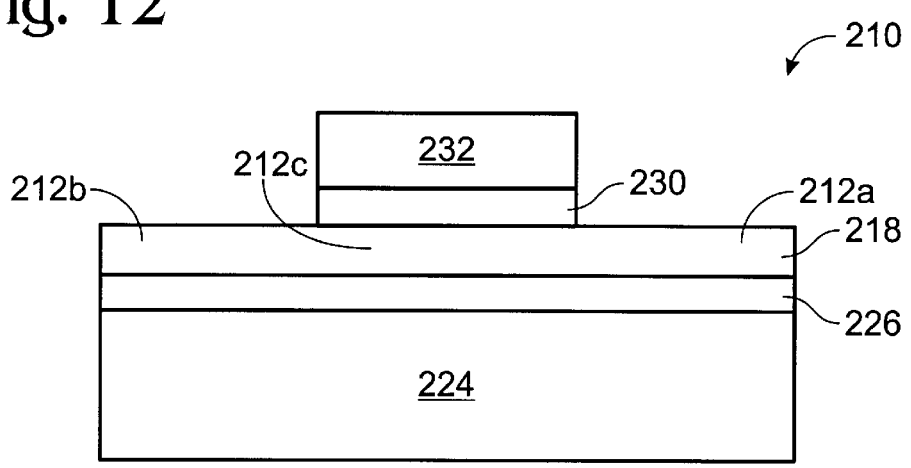

FIG. 12 depicts transistor 210 after annealing. A gate oxide layer 230 is shown overlying channel region 212c, interposed between source 212a and drain 212b. A gate electrode 232 overlies gate oxide layer 230, and a top gate TFT is fabricated. Alternately, the present invention is used in the fabrication of bottom gate TFTs. As is well known in the art and, therefore, not shown, a gate electrode is deposited over the glass substrate, and the gate oxide layer deposited overlying the gate electrode. The formation of source 212a, drain 212b, and channel 212c regions remains essentially the same regardless of whether a bottom or top gate TFT is formed.

Typically, phosphorous or boron are implanted into source/drain 212a/212b. Transistor 210 is then annealed to activate the implanted species. As in conventional processes, transistor 210 is covered with an intermetal insulator (not shown), and contact holes are defined to gate 232, source 212a and drain 212b. The above-described process of TFT formation results in transistor active areas having high electron mobility and low leakage currents.

Figure 13:
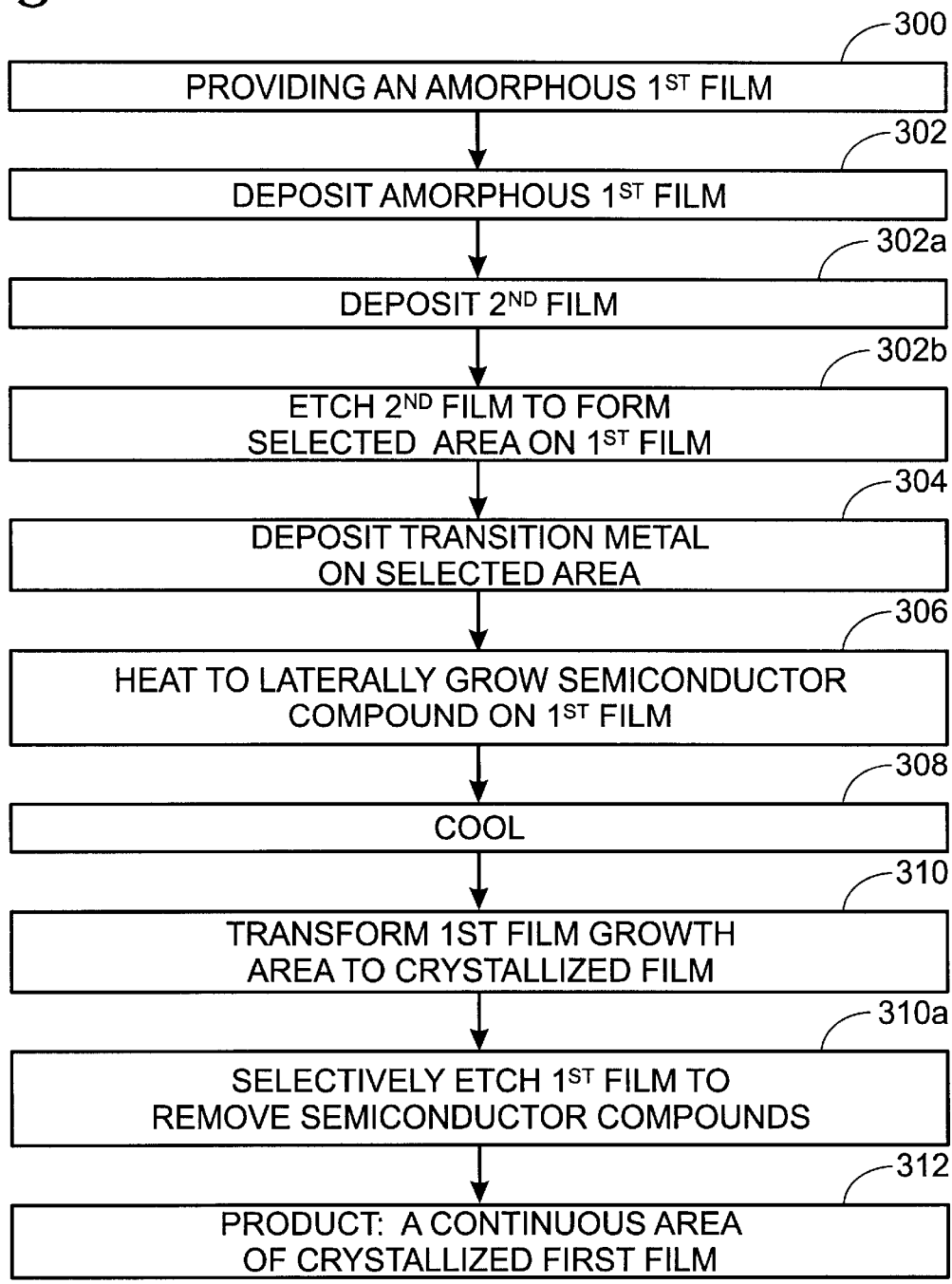
FIG. 13 is a flow chart depicting the present invention method for crystallizing an amorphous film.

FIG. 13 is a flow chart depicting the present invention method for crystallizing an amorphous film. Step 300 provides a first film. Step 302 deposits a layer of first film having a horizontal top surface. Step 302 includes a first film selected from the group consisting of silicon, germanium, silicon carbide, and silicon-germanium compounds. Step 302 includes selecting the first film from the group consisting of amorphous material and amorphous material embedded with microcrystallites to further the crystallization process. In some aspects of the invention Step 302 includes the first film thickness being in the range between 200 and 10,000 Å.

Step 304 deposits a transition metal on selected areas of the first film layer top surface, forming a transition metal nucleus. Step 304 includes depositing a transition metal selected from the group consisting of Al, Ni, Ti, Co, and Pd. In one aspect of the invention, Step 304 includes the transition metal nucleus being a thin discontinuous film deposited on selected areas having an area in the range between 1 and $1000\mu^2$. Step 304 also includes the transition metal nucleus having a concentration of $1\times10^{18}$ atoms per cubed centimeter in the first film.

Step 306 heats the amorphous first film with the transition metal, laterally growing, in an expanding horizontal front from the selected areas, a first film of transition metal semiconductor compounds in a growth area, which is large compared to the transition metal nucleus selected area, between the expansion front and the transition metal nucleus. In one aspect of the invention Step 306 includes using an RTA process at a temperature in the range between 600 and 800 degrees C., and a time duration in the range between 1 second and 15 minutes. In another aspect, Step 306 uses an RTA process at a temperature sufficient to induce lateral growth at a velocity in the range between 0.01 and $10\mu$ per second.

In one aspect of the invention, Step 304 includes the transition metal nucleus selected areas having an area in the range between 5 and $50\mu^2$, and Step 306 includes the lateral growth velocity in the range between 0.1 and 1 $\mu$m, whereby the layout is aided by the transition nucleus being small enough to deposit between device patterns.

In another aspect of the invention, Step 304 includes a transition metal nucleus being a thin discontinuous film deposited on a selected area of approximately $16\mu^2$, and Step 306 includes using an RTA process at a temperature in the range between 700 and 730 degrees C., and a time duration of approximately 1 minute. Then, Step 306 includes a lateral growth velocity in the range between 0.1 and $1\mu$m per second.

Typically, Step 306 includes a lateral growth front extending approximately 30 $\mu$m from the border around the transition metal nucleus selected area deposited in Step 304.

Step 308 cools the first film, whereby the first film is annealed. That is, the annealing process is completed. Step 310, simultaneously with the cooling of Step 308, transforms the growth area between the transition metal nucleus selected area formed in Step 304 and the expansion front established in Step 306 in a crystallized first film. Step 312 is a product, where a continuous area of crystallized first film is formed after annealment.

In some aspects of the invention, the ratio of the growth area of Step 310 and the selected area of Step 304 is greater than 10 to 1. Typically the ratio is greater than 100 to 1.

In some aspects of the invention, a further step follows Step 310, and precedes Step 312. Step 310a selectively etches the first film annealed in Steps 306–308 to remove any transition metal semiconductor compounds on the expansion front established in Step 306 and the transition metal nucleus selected areas formed in Step 304. In this manner, a crystallized first film remains for subsequent processing into the active regions of a transistor.

In some aspects of the invention, further steps precede Step 306. Step 304a (not shown) ramps the temperature up from the preheating temperature to the annealing temperature of Step 306 at a rate greater than 5 degrees C. per second. In this manner, the first film is annealed at the intended temperature of Step 306 for larger crystal grains.

One aspect of the invention includes a further steps, preceding Step 304. Step 302a deposits a second film layer overlying the first film. Step 302b selectively etches the second film deposited in Step 302a, forming openings through the second film to access and define the first film selected areas. Then, Step 304 includes depositing the transition metal through the openings etched in Step 302b to form transition metal nucleuses in the first film selected areas. Ion implantation is another method of depositing transition metal in Step 304.

In some aspects of the invention, Step 300 provides a glass substrate and a barrier layer overlying the glass substrate. Then, Step 302 includes depositing the first film overlying the barrier layer and glass substrate.

One aspect of the invention includes further steps (not shown), following Step 310a. Step 310b forms transistor source, drain, and channel regions with the annealed film not removed in Step 310a, whereby the source, drain, and channel regions are formed from crystallized first film without the presence of transition metal semiconductor compound. Step 310c forms a gate oxide layer overlying the source, drain, and channel regions formed in Step 310b. Step 310d forms a gate electrode overlying the gate oxide, Step 310e implants doping species, and Step 310f anneals to activate implanted species. The present invention method is also applicable to the formation of bottom gate TFTs. Then, the gate electrode is formed in Step 300a (not shown), and the gate oxide is deposited in Step 300b.

FIG. 14 is a flow chart illustrating another aspect of the method for crystallizing an amorphous film. Step 400 provides a first film. Step 402 deposits a transition metal nucleus on a selected area of the first film. Step 404 anneals the first film and transition metal, forming an area of large grain crystallized first film in a growth area at least 100 times larger than the transition metal nucleus selected area, located between the transition metal nucleus selected area and an expansion front on transition metal semiconductor compound. Step 406 etches to remove the transitional metal semiconductor compound in the expansion growth front. At this time, any transition metal semiconductor compound remaining in and around the nucleus selected site is removed. Step 408 is a product, a continuous film of crystallized first film is formed with high electron mobility.

A method and product have been disclosed to form a sheet of crystallized amorphous silicon, in an early stage of transistor production, before the source and drain regions are defined. The method takes advantage of high annealing temperatures and transition metals to speed the lateral growth of silicide. The higher temperatures also promote a more isotropic di-silicide growth front, which is less likely to leave amorphous enclaves in the silicon. A small transition metal nucleation site, in turn, can be more easily located near the center of a transistor. After annealing, the areas close to the silicide nucleation site form large grain polycrystalline silicon, which is desirable for the formation of source/drain and channel regions. Silicide products are etched away when the area of the source and drain are defined. Other variations and embodiments of the present invention will occur to those skilled in the art.

What is claimed is:

1. A method of crystallizing amorphous semiconductor material overlying a glass substrate to provide for the formation of thin film transistors having increased electron mobility, the method comprising the steps of:
    a) in an active area of the amorphous semiconductor material where a thin film transistor is formed, depositing a nucleus of transition metal on a selected area of the semiconductor material;
    b) inducing the crystallization of the amorphous semiconductor material in a crystallized region surrounding the nucleus of transition metal deposited in step a) by means of a single rapid thermal annealing step consisting of:
        ramping up the temperature to an annealing temperature in the range between 600 and 800 degrees C. and maintaining said annealing temperature for a duration in the range between 1 second and 15 minutes, the induced crystallization proceeding outwardly from said nucleus of transition metal along a lateral growth front that expands to cover an area at least ten times the size of the selected area of the nucleus, whereby said crystallized region is formed in the active area where a thin film transistor is formed; and
    c) cooling the semiconductor material following said duration of said single rapid thermal annealing step of step b), whereby a continuous region of crystallized semiconductor material having high electron mobility is formed.

2. A method as in claim 1 including a further step, following step c), of:
    d) selectively etching the crystallized semiconductor material in the region of the lateral growth front to remove transition metal semiconductor compounds from adjacent said crystallized region surrounding said nucleus and selectively etching the transition metal nucleus, whereby a crystallized region remains for subsequent processing in the active regions of a transistor.

3. A method as in claim 1 in which step a) includes depositing a transition metal selected from the group consisting of Al, Ni, Ti, Co, and Pd.

4. A method as in claim 1 in which said single rapid thermal annealing step of step b) further includes:
    ramping the temperature up to the annealing temperature at a rate greater than 5 degrees C. per second, whereby the crystallized region surrounding the nucleus is annealed at the intended temperature of step b) for larger crystal grains.

5. A method as in claim 2 including the further steps of:
    e) forming transistor source, drain, and channel regions in the crystallized region within the region of the lateral growth front where transition metal semiconductor compounds were removed in step d), whereby the source, drain, and channel regions are formed in said crystalized region without the presence of transition metal semiconductor compounds;
    f) forming a gate oxide layer;
    g) forming a gate electrode;
    h) implanting doping species; and
    i) annealing to active the implanted species, whereby TFTs are formed.

6. A method as in claim 1 in which the amorphous semiconductor material on which the method of crystallizing is carried out is selected from the group consisting of silicon, germanium, silicon carbide, and silicon-germanium compounds.

7. A method as in claim 1 in which the amorphous semiconductor material on which the method of crystallizing is carried out is selected from the group consisting of amorphous material and amorphous material embedded with microcrystallites.

8. A method as in claim 1 in which said nucleus of transition metal deposited in step a) is a thin discontinuous film of transition metal deposited on selected areas of the amorphous semiconductor material, each selected area having an area generally in the range of 5 to $50\mu^2$, and the induced crystallization in the region surrounding the nucleus in step b) grows laterally along said lateral growth front at a lateral growth velocity generally in the range of 0.1 to $1\mu$ per second.

9. A method as in claim 1 in which the nucleus of transition metal deposited in step a) has a concentration of $1 \times 10^{18}$ atoms per cubed centimeter in said amorphous semiconductor material.

10. A method as in claim 1 in which the induced crystallization that proceeds outwardly from said nucleus of transition metal along a lateral growth front in step b) expands to cover an area at least 100 times the size of the selected area of the nucleus.

11. A method as in claim 1 in which rapid thermal annealing step b) includes annealing the amorphous semiconductor material at an annealing temperature generally in the range of 650 to 750 degrees C.

12. A method as in claim 11 in which said step of inducing crystallization by means of said single rapid thermal annealing step of step b) includes rapid thermal annealing the amorphous semiconductor material by ramping up the temperature to an annealing temperature generally in the range of 700 to 730 degrees C.

13. A method as in claim 1 including an additional step, prior to said step of inducing crystallization by means of a single rapid thermal annealing step in step b), of preheating the amorphous semiconductor material to a preheat temperature below approximately 600 degrees C., and then, in step b), ramping the temperature up to said annealing temperature from said preheat temperature.

14. A method of crystallizing amorphous semiconductor material overlying a glass substrate to provide for the formation of thin film transistors having increased electron mobility, the method comprising the steps of:
    a) in an active area of the amorphous semiconductor material where a thin film transistor is formed, depositing a nucleus of transition metal on a selected area of the semiconductor material, the size of the nucleus being generally in the range of 5 to $50\mu^2$;

b) inducing the crystallization of the amorphous semiconductor material in a crystallized region surrounding the nucleus of transition metal deposited in step a) by means of a single rapid thermal annealing step consisting of:

ramping up the temperature to an annealing temperature in the range between 600 and 800 degrees C. and maintaining said annealing temperature for a duration in the range between 1 second and 15 minutes, the induced crystallization proceeding outwardly from said nucleus of transition metal along a lateral growth front that surrounds said crystallized region and that expands to cover an area at least 100 times the size of the nucleus, whereby said crystallized region is formed in the active area where a thin film transistor is formed;

c) cooling the semiconductor material following said duration of said single rapid thermal annealing step of step b), whereby a continuous region of crystallized semiconductor material having high electron mobility is formed; and d) selectively etching the area along said lateral growth front that surrounds said crystallized region to remove transition metal semiconductor compounds from adjacent said crystallized region, and selectively etching the transition metal nucleus, whereby said crystallized region remains for subsequent processing in the active regions of a transistor.

15. A method as in claim 14 in which said active area where the nucleus of transition metal is deposited in step a) includes a device pattern area where source, drain, and channel areas of a thin film transistor are subsequently formed, and said nucleus deposited in step a) is deposited outside the device pattern area and close enough to the pattern such that said crystallized region formed during steps b) and c) encompasses said device pattern area.

16. A method as in claim 15 including the further steps, following step d), of:

e) forming transistor source, drain, and channel regions in said crystallized region within the region of the lateral growth front where transition metal semiconductor compounds were removed in step d), whereby the source, drain, and channel regions are formed in said crystallized region without the presence of transition metal semiconductor compounds;

f) forming a gate oxide layer;

g) forming a gate electrode;

h) implanting doping species; and i) annealing to active the implanted species, whereby a TFT is formed.

17. A method as in claim 14, in which the amorphous semiconductor material on which the method of crystallizing is carried out is selected from the group consisting of silicon, germanium, silicon carbide, and silicon-germanium compounds.

18. A method as in claim 14 in which the temperature selected for carrying out rapid thermal annealing step b) is selected to induce crystallization along said lateral growth front at a lateral growth velocity generally in the range of 0.1 to $1\mu$ per second.

19. A method as in claim 14 in which step b) includes annealing the amorphous semiconductor material at an annealing temperature generally in the range of 650 to 750 degrees C.

20. A method as in claim 19 in which said step of inducing crystallization by means of a single rapid thermal annealing step in step b) includes annealing the amorphous semiconductor material at an annealing temperature generally in the range of 700 to 730 degrees C.

21. A method as in claim 14, including an additional step, prior to said step of inducing crystallization by means of a single rapid thermal annealing step in step b), of preheating the amorphous semiconductor material to a preheat temperature below approximately 600 degrees C., and then, in step b), ramping the temperature up to said annealing temperature from said preheat temperature.

* * * * *